(12) United States Patent
Gruening et al.

(10) Patent No.: US 6,593,612 B2
(45) Date of Patent: Jul. 15, 2003

(54) STRUCTURE AND METHOD FOR FORMING A BODY CONTACT FOR VERTICAL TRANSISTOR CELLS

(75) Inventors: Ulrike Gruening, Munich (DE); Helmut Klose, Munich (DE); Wolfgang Bergner, Stormville, NY (US)

(73) Assignee: Infineon Technologies AG, Munich (DE)

( * ) Notice: Subject to any disclaimer, the term of this patent is extended or adjusted under 35 U.S.C. 154(b) by 20 days.

(21) Appl. No.: 09/730,150

(22) Filed: Dec. 5, 2000

(65) Prior Publication Data

US 2002/0066925 A1 Jun. 6, 2002

(51) Int. Cl.⁷ ............... H01L 27/108; H01L 29/94; H01L 31/119; H01L 29/76
(52) U.S. Cl. ......................... 257/301; 257/302
(58) Field of Search ................ 257/295–310; 438/238–253

(56) References Cited

U.S. PATENT DOCUMENTS

| | | |
|---|---|---|
| 4,210,926 A | 7/1980 | Hacke |
| 4,219,829 A | 8/1980 | Dorda et al. |
| 5,519,236 A * | 5/1996 | Ozaki ..................... 257/302 |

\* cited by examiner

*Primary Examiner*—Cuong Quang Nguyen
(74) *Attorney, Agent, or Firm*—Stanton Braden

(57) ABSTRACT

A semiconductor memory cell, in accordance with the present invention includes a deep trench formed in a substrate. The deep trench includes a storage node in a lower portion of the deep trench, and a gate conductor formed in an upper portion of the deep trench. The gate conductor is electrically isolated from the storage node. An active area is formed adjacent to the deep trench and is formed in the substrate to provide a channel region of an access transistor of the memory cell. A buried strap is formed to electrically connect the storage node to the active area when the gate conductor is activated. A body contact is formed opposite the deep trench in the active area and corresponding in position to the buried strap to prevent floating body effects due to outdiffusion of the buried strap. Methods for forming the body contact are also described.

4 Claims, 12 Drawing Sheets

STRUCTURE AND METHOD FOR FORMING A BODY CONTACT FOR VERTICAL TRANSISTOR CELLS

BACKGROUND

1. Technical Field

This disclosure relates to semiconductor devices and methods for fabrication thereof and more particularly, to body-contacts formed in a vertical transistor memory cell to avoid floating body problems.

2. Description of the Related Art

Semiconductor memory devices, which include vertical transistors often rely on outdiffusion from buried straps to form a connection between a deep trench storage node and a contact. As shown in FIG. 1, a top view of a partially fabricated dynamic random access memory chip 10 is shown. Four memory cells are depicted, each memory cell includes a deep trench 14. Active areas 16 include diffusion regions. Adjacent to active areas 16 are formed isolation trenches 18 filled with a dielectric material. A buried strap 20 is shown for one of the memory cells 12. A collar 22 of an adjacent cell and two adjacent isolation trenches 18 form a three-sided isolation region encapsulating buried strap 20.

Referring to FIG. 2, a cross-sectional view, taken at section line 2—2 of FIG. 1, is shown. Memory cell 12 includes a vertical transistor 26 employed for accessing a storage node 28 in deep trench 14. When scaling down sizes of memory cells, buried strap 20 outdiffusion regions begin to extend as far as a neighboring memory cell's collar regions 23. Buried strap 20 may form an extended outdiffusion region 30, which may extend to the collar 23 of a neighboring memory cell 21. If contact is made with the neighboring cell's collar 22 by region 30, pinch-off of the access transistor 26 begins to occur. For memory cells which feature vertical access transistors surrounded by a 3-sided isolation, as shown in FIG. 1, floating body effects may arise, similar to those encountered in silicon on insulator structures, if the buried strap's outdiffusion 30 reaches the opposite isolating collar 22 and pinches off the contact to the transistor body.

Floating body effects are caused when the body of a transistor gets electrically isolated from a conductive medium by either an insulator or an area with opposite doping (junction). In silicon on insulator (SOI) transistor structures, an insulator separates two silicon structures, one of which includes a channel region of the transistor device (e.g., transistor body). The potential at the transistor channel cannot be set to a specific value, but changes according to the voltage conditions applied to the adjacent source/drain junctions (i.e., the transistor channel voltage is floating and adjusts thermodynamically to its surroundings). Hence, the transistor threshold voltage changes with varying body bias, leading to parasitic leakage from the transistor. This is undesirable.

Similar effects, as described above with reference to FIGS. 1 and 2, are encountered in vertical transistor structures if the transistor body is disconnected from the silicon substrate by a lower source, drain junction.

Therefore, a need exists for a structure and method for forming said structure, which eliminates floating body potentials in memory devices with vertical transistors.

SUMMARY OF THE INVENTION

A semiconductor memory cell, in accordance with the present invention includes a deep trench formed in a substrate. The deep trench includes a storage node in a lower portion of the deep trench, and a gate conductor formed in an upper portion of the deep trench. The gate conductor is electrically isolated from the storage node. An active area is formed adjacent to the deep trench and is formed in the substrate to provide a channel region of an access transistor of the memory cell. A buried strap is formed to electrically connect the storage node to the active area when the gate conductor is activated. A body contact is formed opposite the deep trench in the active area and corresponding in position to the buried strap to prevent floating body effects due to outdiffusion of the buried strap. Methods for forming the body contact are also described.

In alternate embodiments, the body contact is preferably integrally formed from the substrate. The body contact may include a portion of a p-well of the substrate. The body contact may include portions that extend into isolation trenches, the isolation trenches being formed adjacent to the active area. The memory cell may be formed on a semiconductor memory chip having a plurality of memory cells, the memory chip including body contacts formed thereon which extend across a plurality of memory cells through isolation trenches, the isolation trenches being formed adjacent to active areas of the memory cells.

A method for forming a body contact for semiconductor memory devices with vertical access transistors, in accordance with the present invention, includes forming a stepped portion in an isolation trench of a first deep trench capacitor memory cell wherein the stepped portion is in contact with a dielectric sidewall of a trench capacitor cell of a memory cell located adjacent to the first memory cell. The dielectric sidewall is disposed opposite to a buried strap region of the first memory cell and disposed vertically between a source region and a drain region of a vertical access transistor of the first memory cell. The stepped portion is connected to a p-well formed in a substrate of the memory device to form a body contact to prevent floating body effects in the vertical access transistor.

In other methods, the step of forming may include the steps of providing a spacer mask to mask the stepped portion, and etching the substrate to form the stepped portion. The step of providing a spacer mask may include the steps of depositing a mask layer over portions of the substrate, patterning the mask layer, and patterning the substrate in accordance with the mask layer to form the stepped portion. The first memory cell may include a collar dielectric formed in a trench of the first deep trench capacitor and the step of providing a spacer mask may further include the steps of selectively etching the substrate relative to the collar dielectric and in accordance with an active area isolation trench mask to recess the substrate back from the collar dielectric to form collar portions which extend above the etched substrate, conformally depositing a mask layer over the collar portions and the substrate, patterning the mask layer, and patterning the substrate in accordance with the mask layer to form the stepped portion. The step of conformally depositing a mask layer may include the step of conformally depositing a silicon layer over the collar portions and the substrate. The step of patterning the mask layer may include the steps of doping first portions of the silicon layer by performing an angled implantation in which dopants are blocked from second portions of the silicon layer and selectively etching away the second portions to pattern the mask layer. The step of selectively etching away the second portions may include performing a wet ammonium hydroxide etch. The stepped portion may extend into the isolation region.

Another method for forming a memory cell including body contacts for preventing floating body effects for memory cell access transistors, in accordance with the present invention includes the steps of forming storage nodes and dielectric collars in deep trenches, the deep trenches being formed in a substrate, patterning isolation trenches into the substrate by selectively etching the substrate relative to the collar dielectric to provide collar dielectric portions which extend above a surface of the etched substrate, depositing a layer of silicon over the collar dielectric and the substrate, doping the silicon layer in selected portions by performing angled dopant implantation such that non-selected portions of the silicon are shielded from dopants by the collar dielectric portions, removing the non-selected portions of the silicon layer and etching the substrate to deepen the isolation trenches in accordance with the selected portions of the silicon layer to form a stepped portion within isolation trenches, the stepped portion forming a body contact such that the body contact is disposed opposite to a buried strap junction formed by dopant outdiffusion from the storage node.

In other methods, the dopants may include boron. The step of removing the non-selected portions of the silicon layer may include performing a wet ammonium hydroxide etch to remove the non-selected portions. The stepped portion may be integrally formed from a p-well of the substrate. The memory cell access transistors may include vertical transistors, and the method may further include the step of forming a gate conductor in the deep trenches above the storage node to form a vertical transistor adjacent to the deep trench.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes a method and structure to create a body contact for memory cells to avoids the floating body problem in vertical access transistors. The present invention forms a body contact from a portion of a substrate. The body contact is preferably integrally formed from a p-well of the substrate. Vertical access transistors surrounded by a 3-sided isolation therefore avoid SOI-like floating body effects, which may have arisen if the buried strap reached an opposite isolating wall of an adjacent memory cell. Advantageously, the buried strap is prevented from pinching off the contact to a transistor body of the vertical access transistor.

In one embodiment, a body contact is formed for a vertical transistor in a memory cell by creating a stepped portion in an isolation trench. The stepped portion is formed from a substrate and is horizontally self-aligned to one sidewall of a trench capacitor of the memory cell. The sidewall is opposite to a buried strap region, and the stepped portion is situated vertically between a source and a drain region of the vertical transistor. The body contact connects to a p-well of the substrate, and a transistor body of the access transistor, formed due to outdiffusion. The transistor body is formed in the substrate and by well doping implants, and the buried strap junction is formed by outdiffusion. The buried strap region is isolated laterally by isolation trenches.

It is to be understood that the present invention will now be described in terms of vertical transistor memory cells. However, the invention is broader and should not be construed as limited by the structures and materials described herein.

Figure 1:
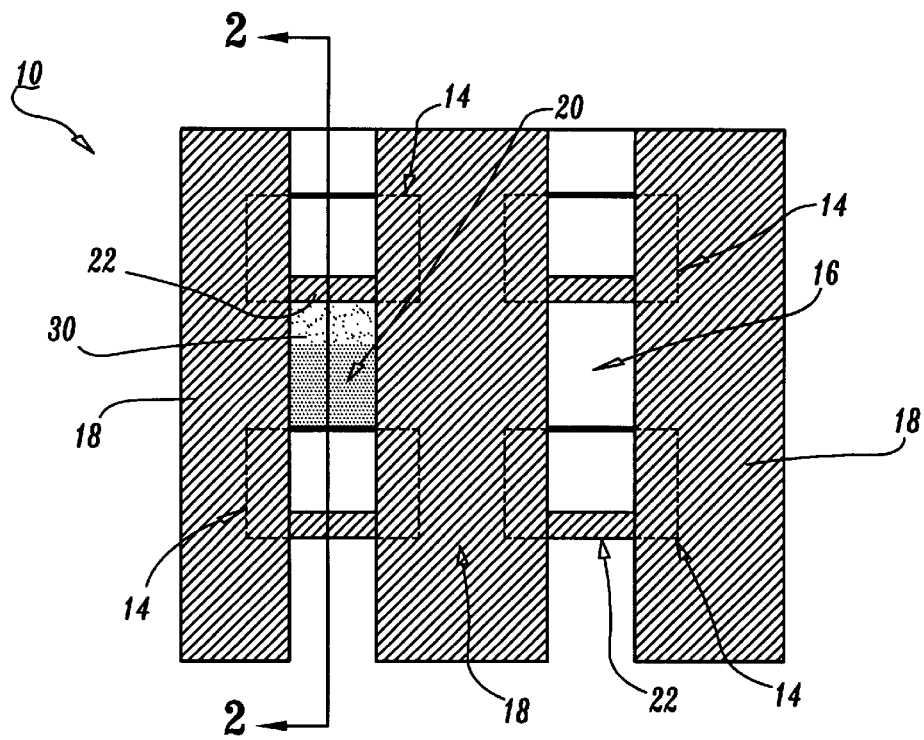
FIG. 1 is a top layout view of a prior art semiconductor memory showing a buried strap with dopant outdiffusion.
Figure 2:
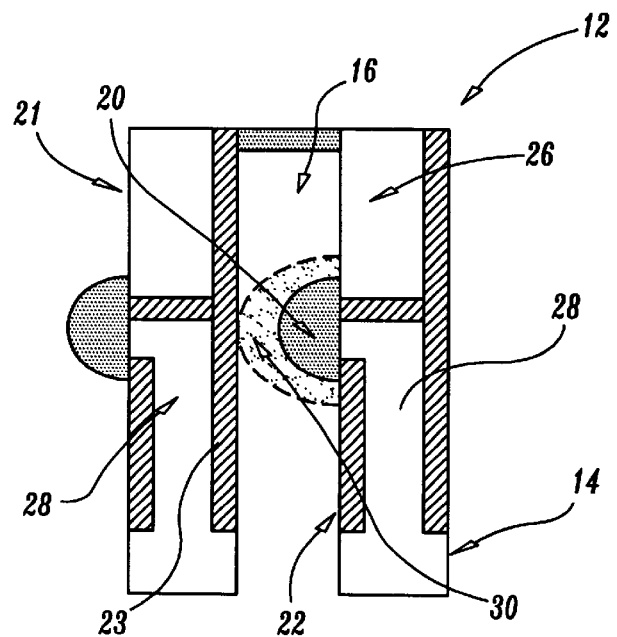
FIG. 2 is a cross-sectional view, taken at section line 2—2, of a prior art semiconductor memory showing pinch off due to the buried strap dopant outdiffusion causing floating body effects.
Figure 3:
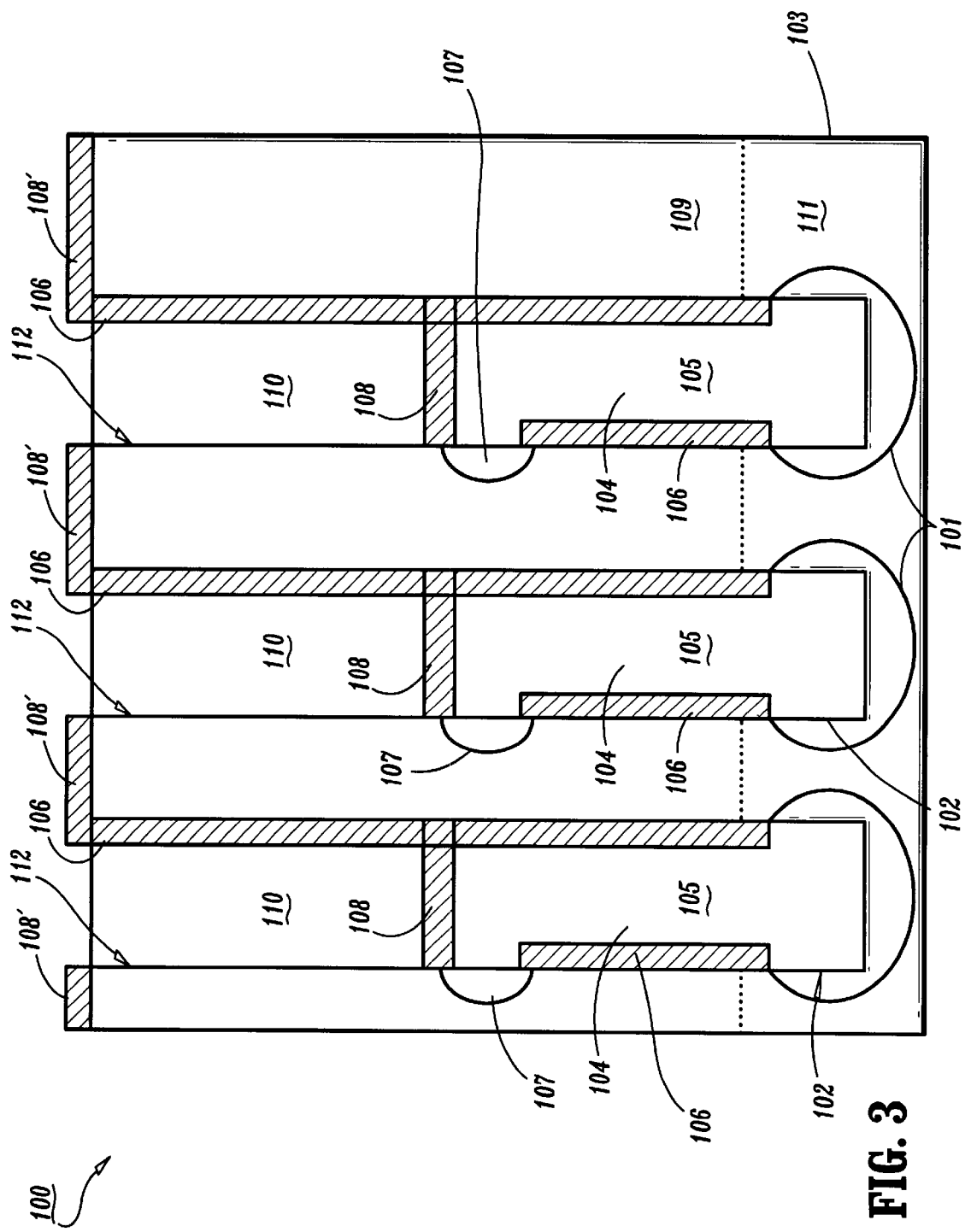
FIG. 3 is a cross-sectional view of a semiconductor memory device showing deep trenches and gate conductors for vertical access transistors formed in accordance with the invention.

Referring now in specific detail to the drawings in which like reference numerals identify similar or identical elements throughout the several views, and initially to FIG. 3, a cross-sectional view of a semiconductor memory device 100 is shown having deep trenches 102 formed in a substrate 103. Substrate 103 is preferably a monocrystalline substrate, which is doped to form an n-well 111 and a p-well 109. A buried plate 101 is formed by outdiffusion from a doped glass, followed by the deposition of a dielectric layer which forms a node dielectric, as known in the art. Buried plate 101 is formed about deep trenches 102 to form a first capacitor plate for a deep trench capacitor. Deep trenches 102 are filled with a conductive material 104, such as doped polysilicon. Conductive material 104 is recessed to expose sidewalls of trench 102. A collar 106 is formed on trench sidewalls, by a localized silicon oxidation (LOCOS), TEOS deposition, or other collar forming process known in the art. Trench 102 is then filled with conductive material 104 to form a storage node 105, which represents a second capacitor plate for the deep trench capacitor.

A buried strap 107 is formed on one side of the trench sidewall (after partially removing the oxide collar 106) from conductive material 104 and outdiffusion from conductive material 104. A trench top oxide 108 (and 108') is formed to isolate storage node 105 from a gate conductor 110 and formed on top of substrate 103. A vertical gate oxide 112 is formed in trench 102. Gate conductor 110 is then formed in trench 102.

Figure 4:
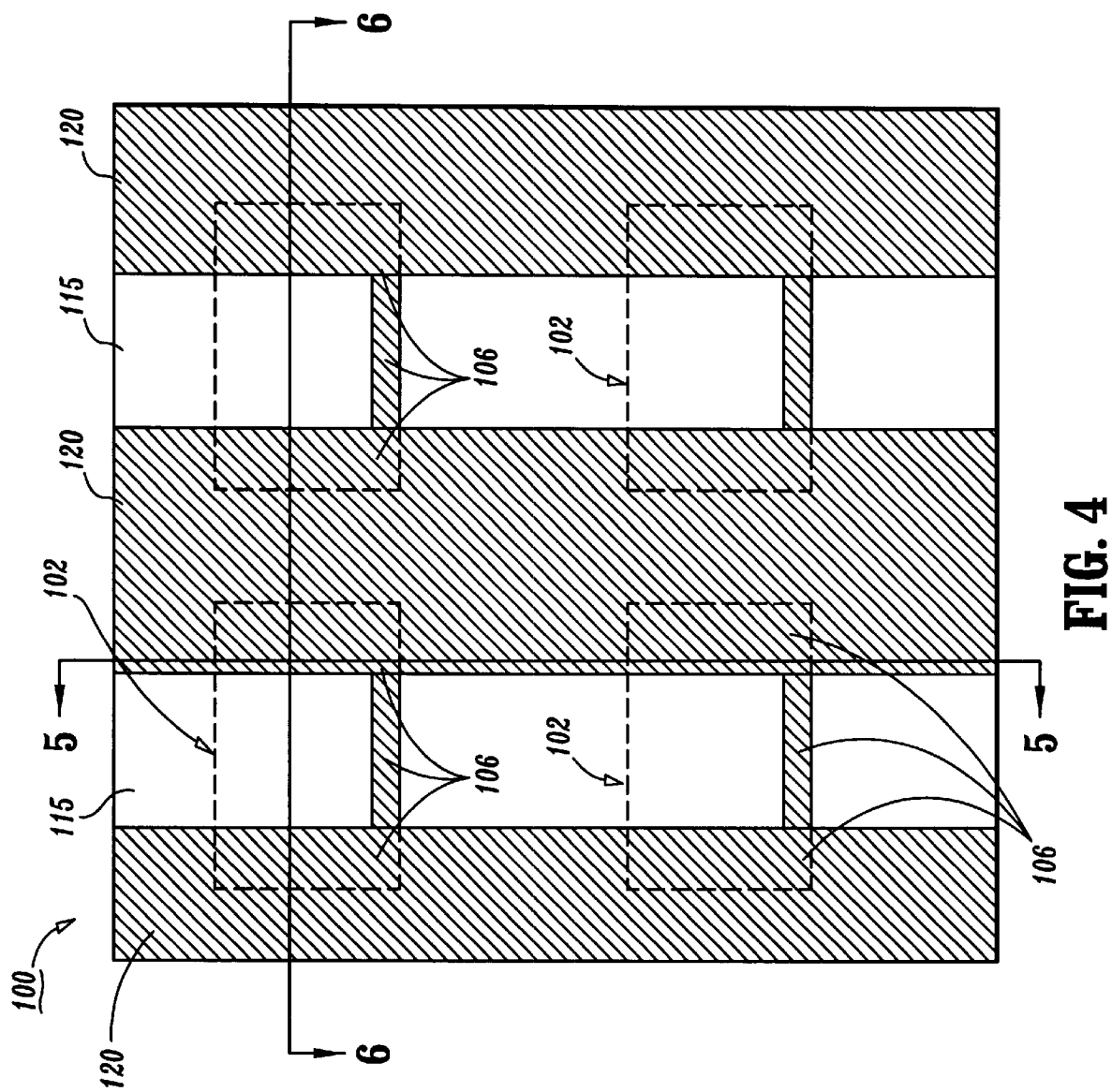
FIG. 4 is an illustrative top layout view of a semiconductor memory showing section lines where cross-sectional views are taken from in the following FIGS.

Referring to FIG. 4, a top layout view is provided for semiconductor device 100. FIG. 4 will be employed in the following FIGS. to identify orientations of cross-sectional views which follow. FIG. 4 shows trenches 102 with collar 106 formed therein. Active areas 115 and isolation trenches 120 are also shown for illustrative purposes. FIGS. 5, 7, 8, 9 and 10 show cross-sectional views taken at section line 5—5 of FIG. 4 at different steps of the processing in accordance with the present invention. FIGS. 6 and 11 show cross-sectional views taken at section line 6—6 of FIG. 4 at different steps of the processing in accordance with the present invention.

Figure 5:
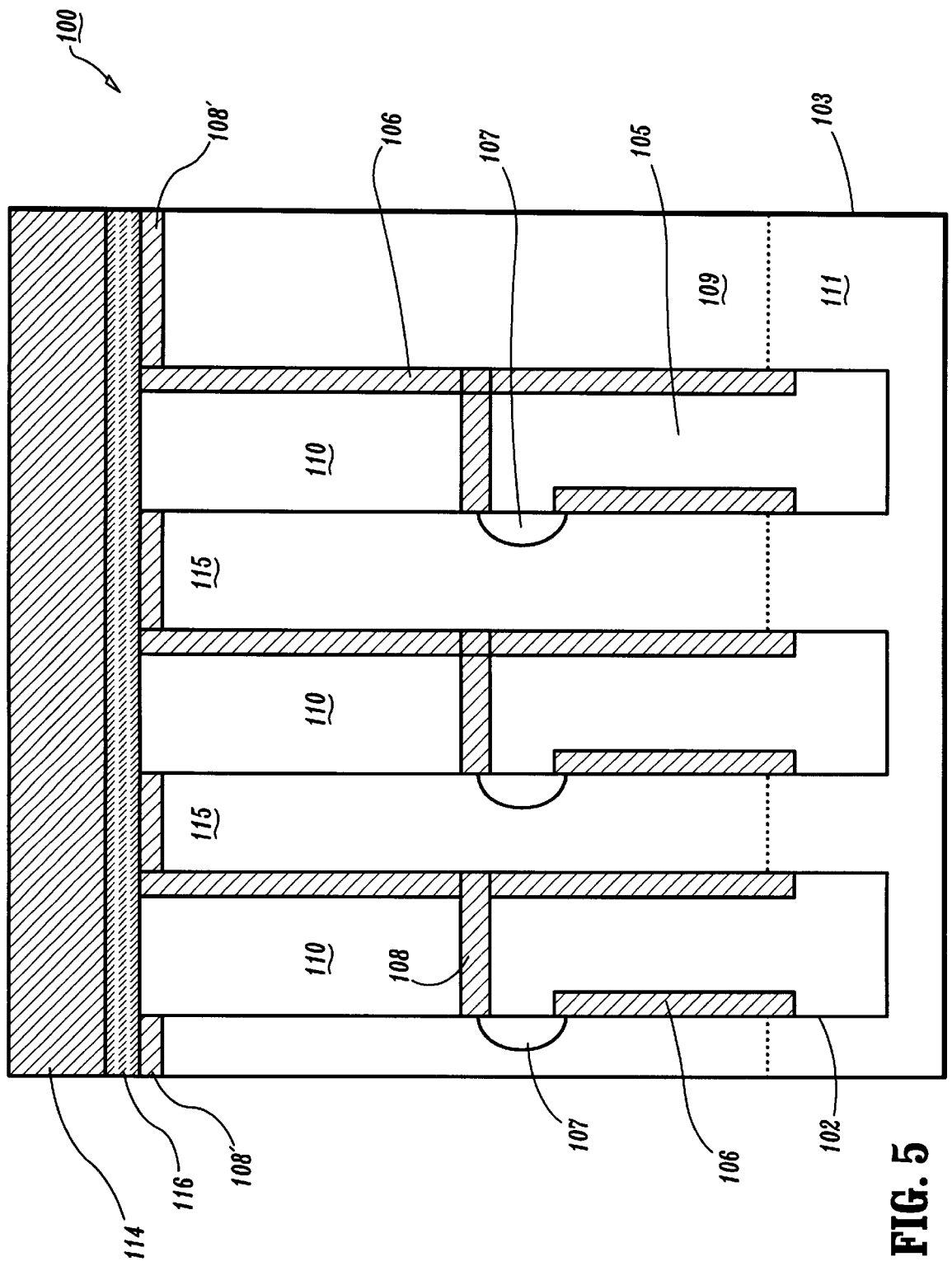
FIG. 5 is a cross-sectional view, taken at section line 5—5 of FIG. 4, showing active area pad layers formed in accordance with the invention.
Figure 6:
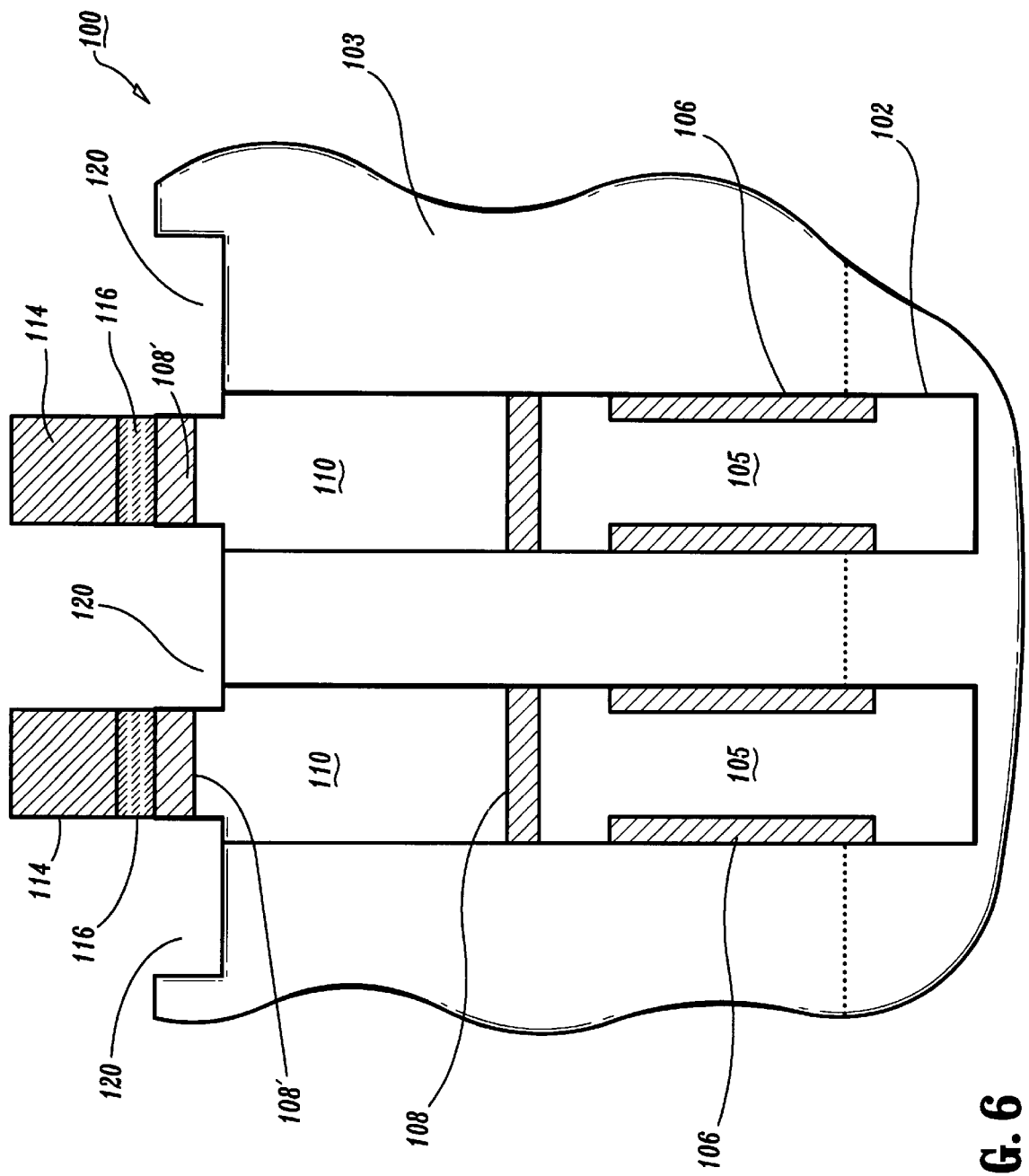
FIG. 6 is a cross-sectional view, taken at section line 6—6 of FIG. 4, showing the active area pad layers of FIG. 5 patterned and showing isolation trenches partially etched in accordance with the invention.

Referring to FIG. 5, active area pad layers are deposited on the structure of FIG. 3. Active area pad layers preferably include a nitride pad layer 116 and an oxide pad layer 114.

Referring to FIG. 6, a resist (not shown) is spun onto pad oxide layer 114 and exposed in an active area (AA) lithography step. An isolation trench mask is patterned into the resist and an AA etch is performed to pattern through layers 114 and 116 and into substrate 103. Partially formed isolation trenches 120 are formed by the etching. The remaining resist is stripped to leave the structure shown in FIG. 6. A dielectric cap 108' (on substrate 103 and below layer 116) formed before layers 114 and 116, provides protection of gate conductor 110.

Figure 7:
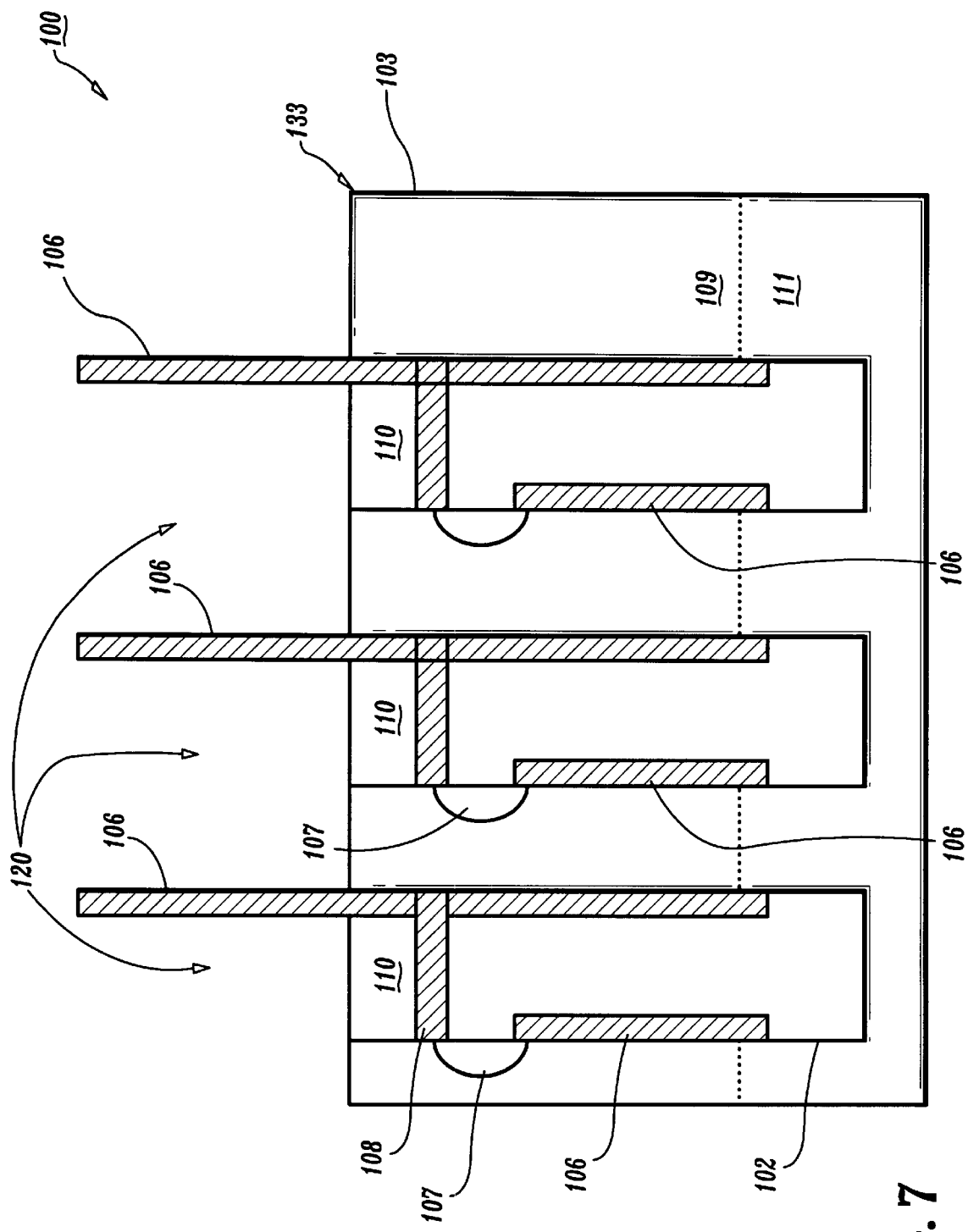
FIG. 7 is a cross-sectional view of the structure of FIG. 5 with the substrate further etched selective to collar dielectric in accordance with the invention.

Referring to FIG. 7, substrate 103 is etched selective to layer 114 (FIG. 6) and oxide of collar 106. Substrate 103 and gate conductor 110 are etched to a depth above buried strap 107 to form isolation trenches 120. This etched depth 133 of substrate 103 represents a top surface of a body contact formed in accordance with the present invention, as described in later steps. Collar 106 remains extended from surface 133, as shown in FIG. 7.

Figure 8:
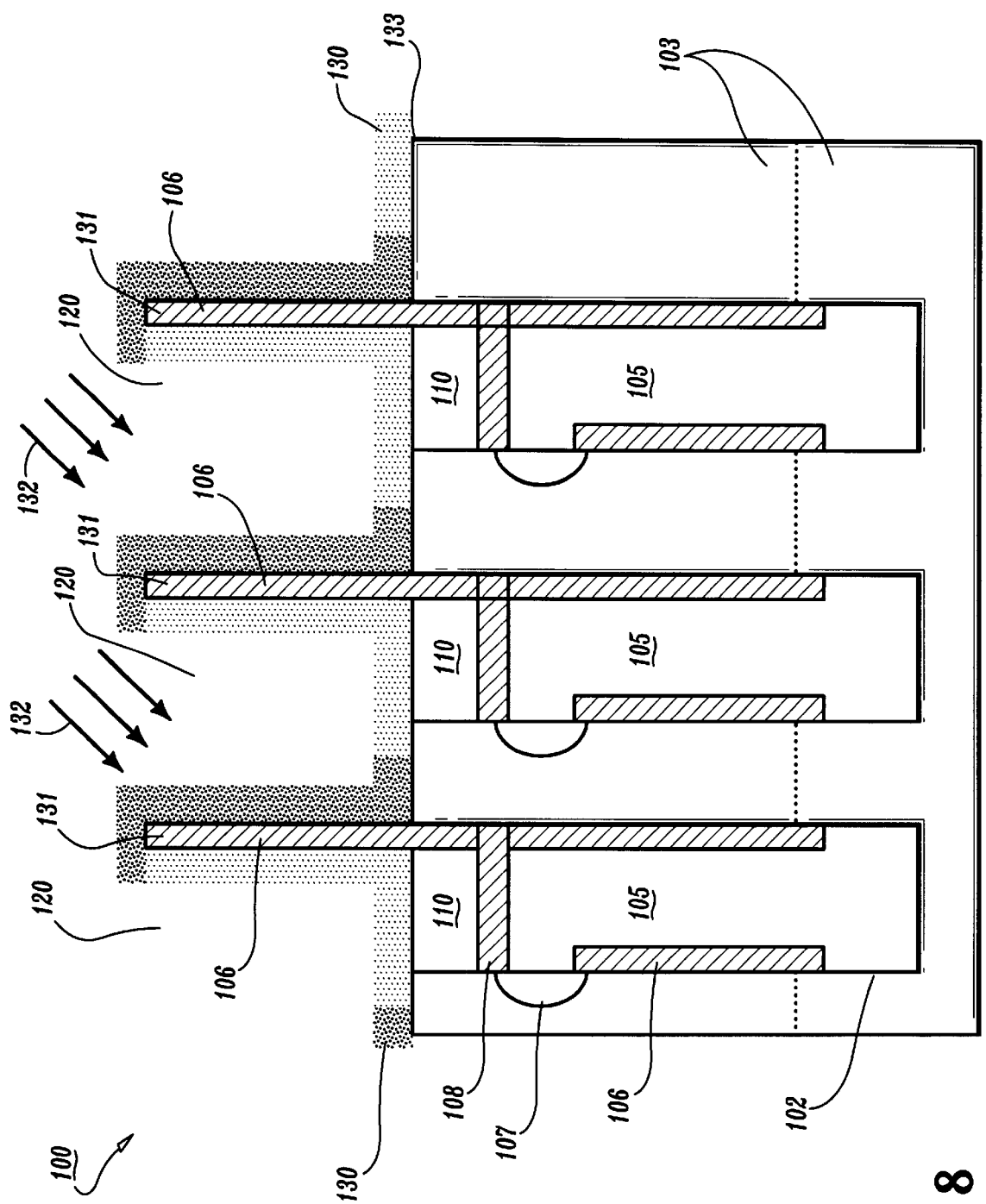
FIG. 8 is a cross-sectional view of the structure of FIG. 7 showing a mask layer deposited and doped by an angled implantation step in accordance with the invention.

Referring to FIG. 8, a silicon layer 130 is conformally deposited over exposed portions of collars 106 and a top surface (surface 133) of device 100. Silicon layer 130 underfills isolation trenches 120. Silicon layer 130 is preferably deposited by employing a physical vapor deposition process. This process results in amorphous or polycrystalline formation. Silicon layer 130 may also be epitaxially grown in a crystalline form. Silicon layer 130 is preferably between about 10 nm and about 30 nm. Silicon layer 130 follows the contours of collar 106, which includes portions elevated above surface 133.

Silicon layer 130 is subjected to an angled implantation process. Dopant ions 132 are employed to dope portions of silicon layer 130. In one embodiment, dopant ions 132 include boron. The implantation of angled dopants 132 into silicon layer 130 selectively dopes layer 130 at the backside of collar portions 133.

Figure 9:
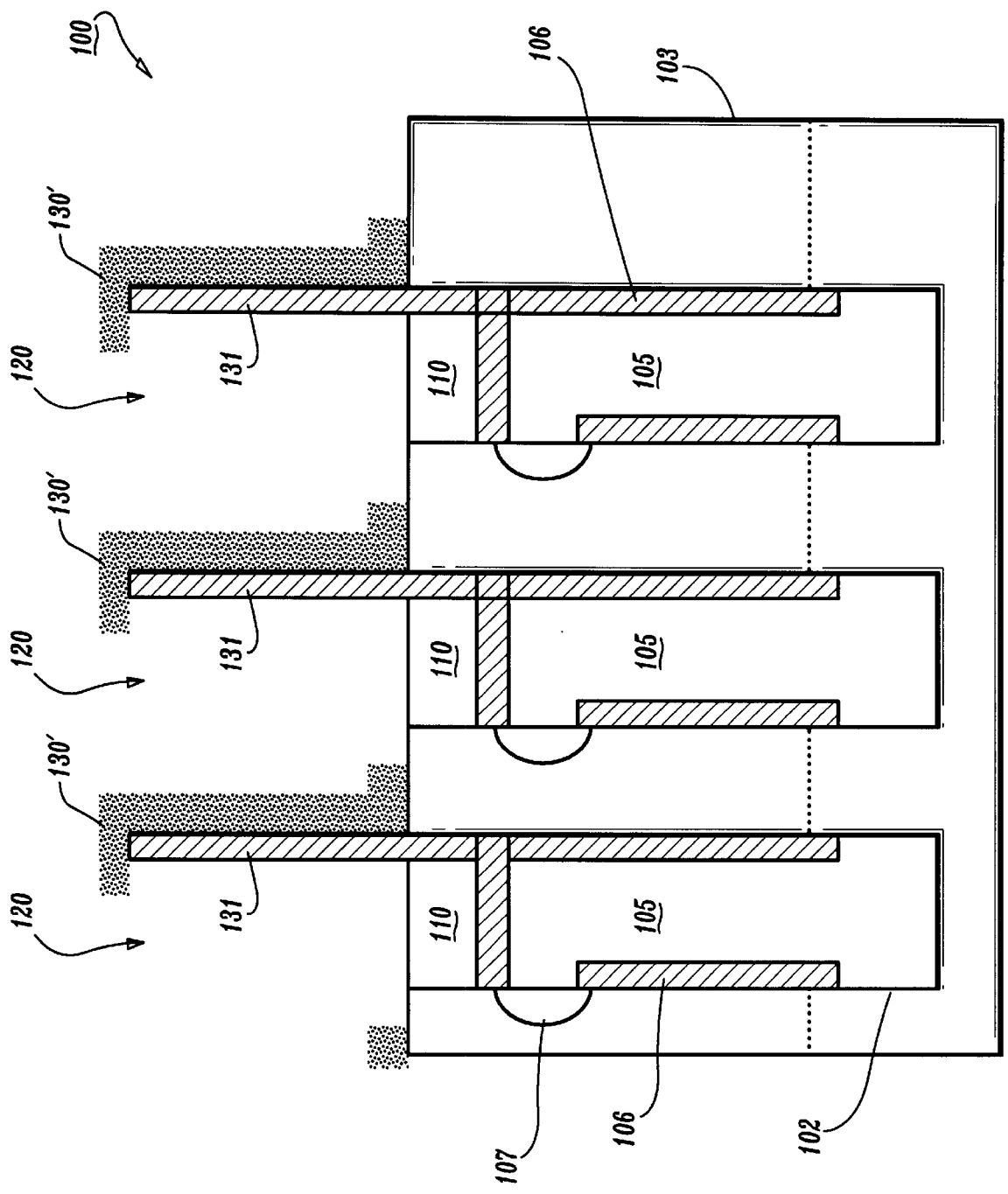
FIG. 9 is a cross-sectional view of the structure of FIG. 8 showing the mask layer selectively etched to form an etch mask for etching the substrate in accordance with the invention.

Referring to FIG. 9, a selective removal of undoped silicon of silicon layer 130 from sidewalls isolation trench 120 is performed. Undoped silicon of silicon layer 130 may be removed by employing, for example, a wet NH$_4$OH etch. The undoped silicon etch leaves a doped silicon layer 130' at the backside of collar sidewall portions 131. Silicon layer 130' will function as an etch mask to form body contacts in accordance with the invention. Other processes may be employed as well, in accordance with the invention, to form an etch mask for etching body contacts.

Figure 10:
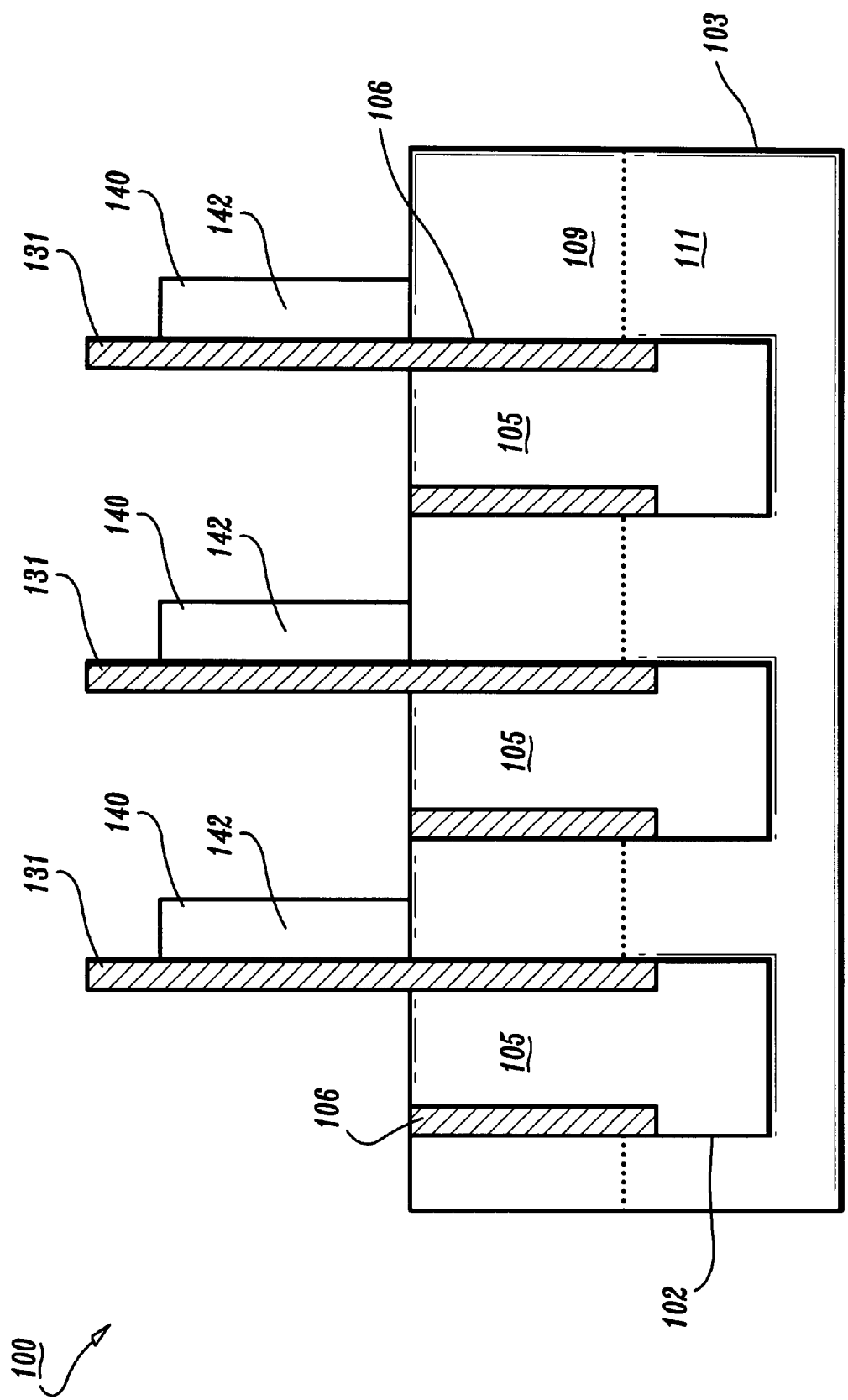
FIG. 10 is a cross-sectional view of the structure of FIG. 9 showing the substrate etched in accordance with the mask to form body contacts in accordance with the invention.
Figure 11:
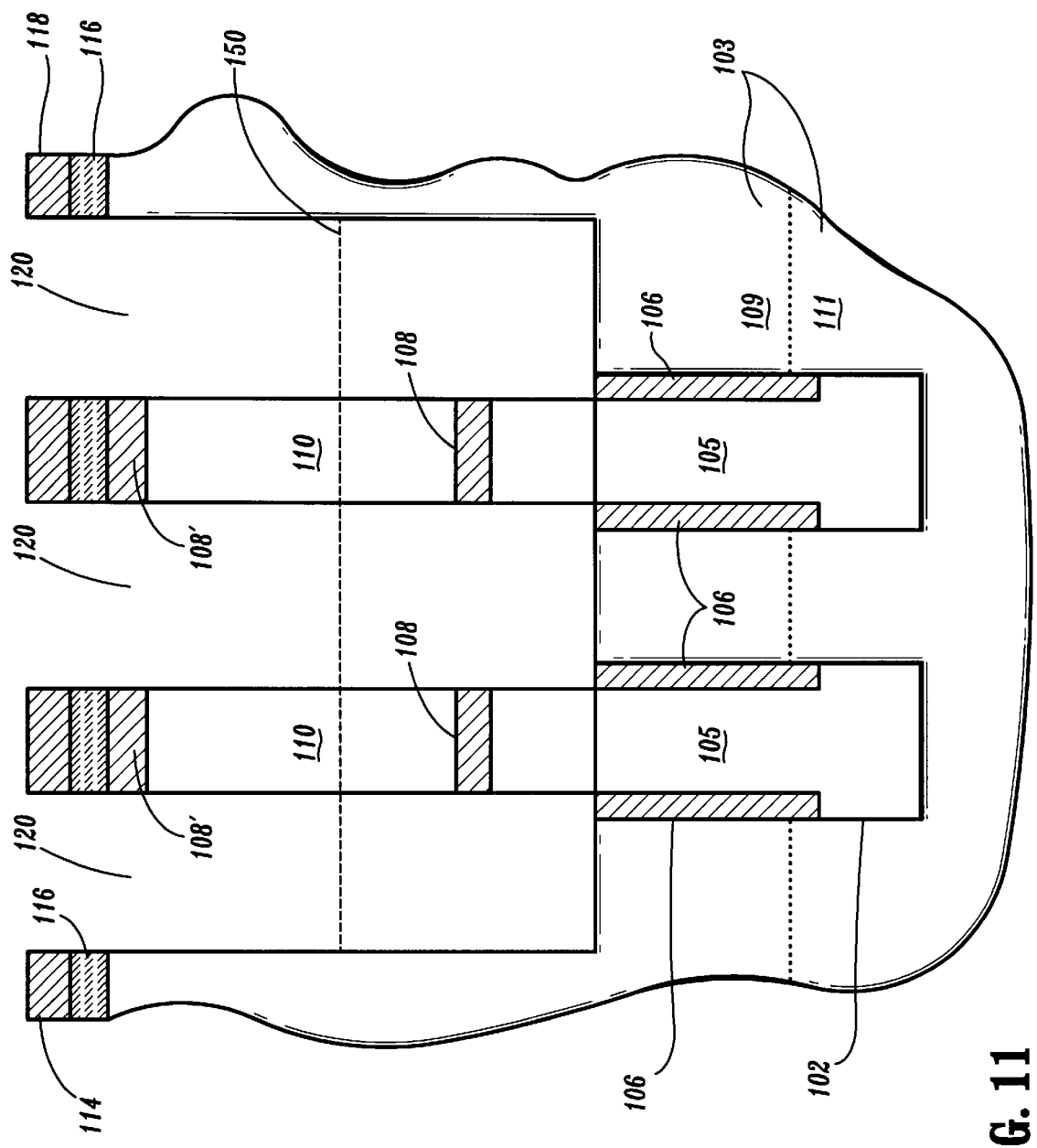
FIG. 11 is a cross-sectional view, taken at section line 6—6 of FIG. 4, after body contacts and isolation trenches are formed in accordance with the invention.

Referring to FIG. 10, etching of isolation trenches 120 is continued with a low or moderate selectivity to oxide, for example, 1.5:1 to 2:1. Doped silicon layer 130' (FIG. 9) is employed as a spacer mask to prevent etching to create a stepped portion 140 in the silicon to form a body contact 142 in accordance with the present invention. Doped silicon layer 130' is preferably consumed during the etch process. A spacer mask may be formed by other methods, which may or may not include employing collar sidewall portions 131. For example, a layer may be formed which employs a lithographic patterning to form body contacts 142.

Referring to FIG. 11, a cross-sectional view taken along section line 6—6 of FIG. 4 is shown. Isolation trenches 120 are now formed. Layer 114 is removed and layer 116 is kept until after isolation trench fill and planarization, and is then removed A top surface 150 of body contacts 142 (shown in phantom lines in FIG. 11) is illustratively shown. Processing may now continue as is known in the art. For example, an AA liner oxidation, oxide deposition to fill isolation trenches and planarization are performed followed by additional steps to complete the memory cells and form metallization structures known to those skilled in the art.

Figure 12:
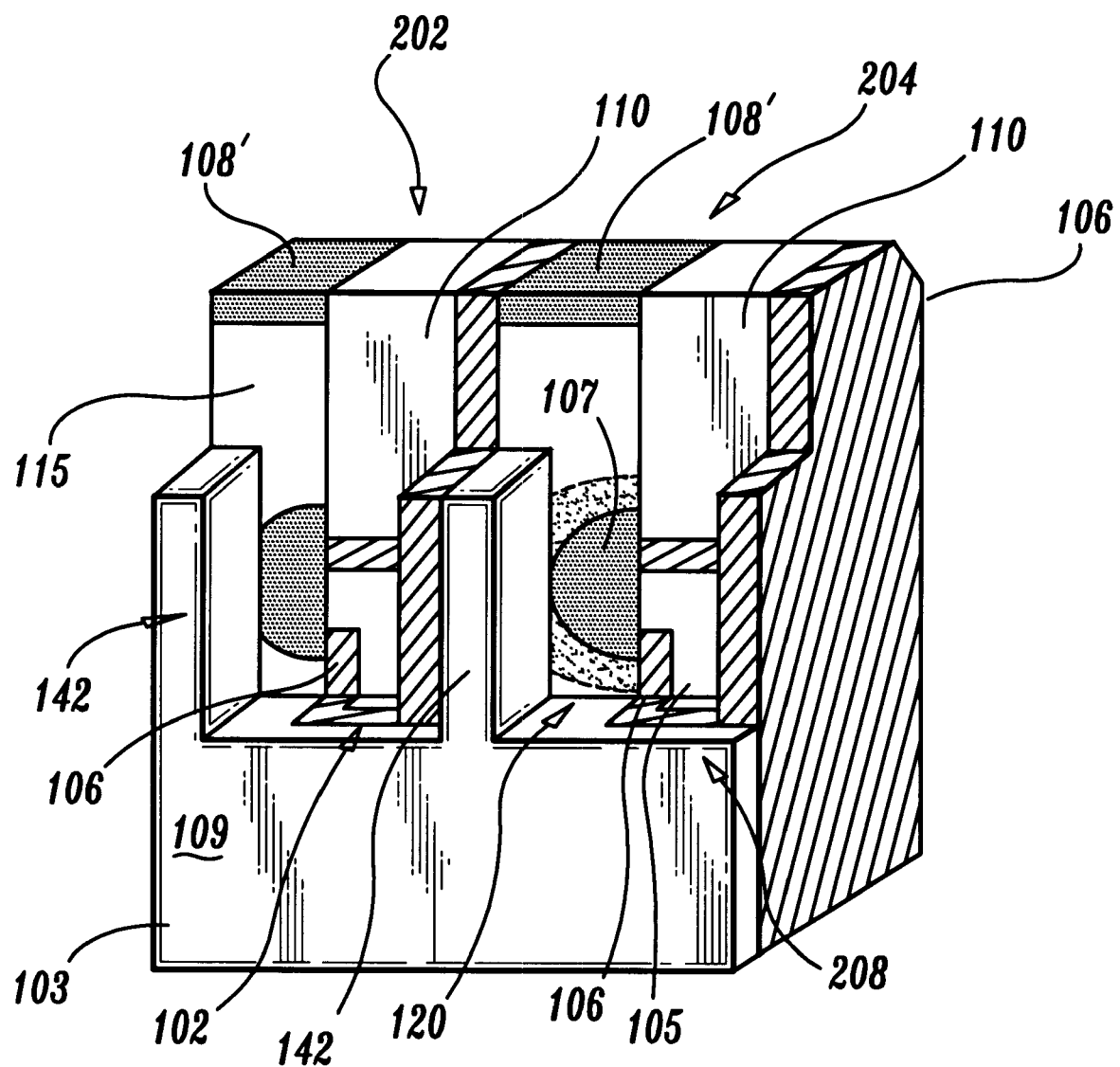
FIG. 12 is a perspective cross-sectional view of a semiconductor memory showing body contacts formed in accordance with the present invention.

Referring to FIG. 12, a perspective cross-sectional view of memory cells 202 and 204 are shown in accordance with the present invention. Body contacts 142 are formed from substrate 103. Body contacts 142 are preferably integrally formed from substrate 103, and, in particular, from a p-well portion 109 of substrate 103. A bottom 208 of isolation trench 120 is shown. Body contacts 142 extend from bottom 208 to a location above a buried strap 107. Body contacts 142 extend outward (from the plane of the page and, although not shown, inward into the plane of the page on the opposite side) into isolation regions 120.

Figure 13:
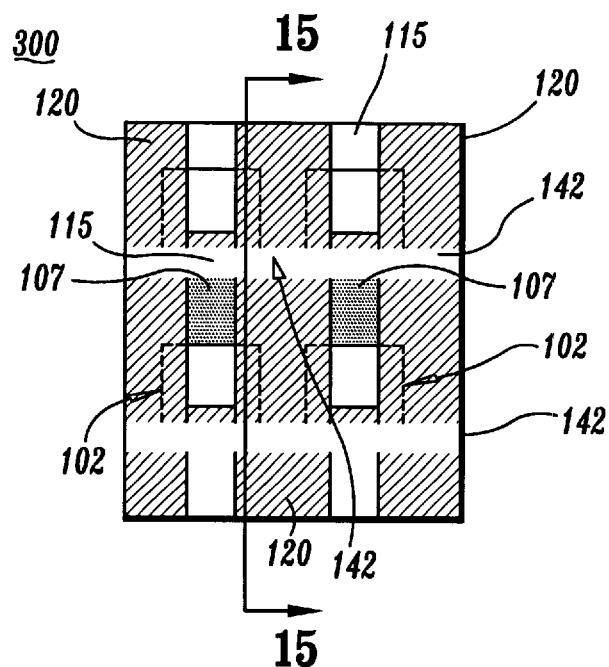
FIG. 13 is a top layout view of a semiconductor memory device showing body contacts continuously formed across the semiconductor memory device in accordance with the present invention.
Figure 14:
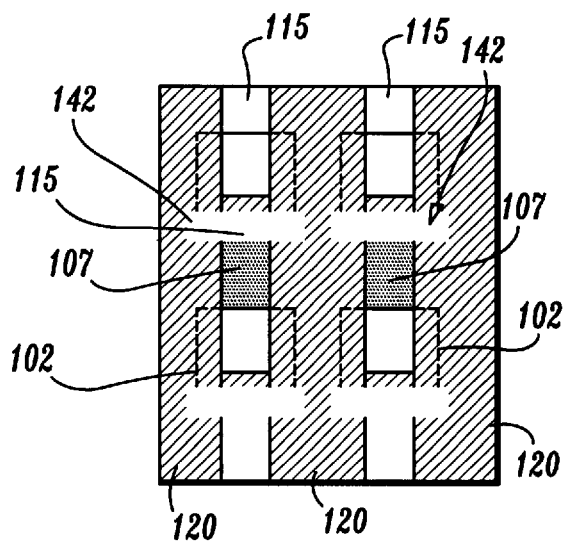
FIG. 14 is a top layout view of a semiconductor memory device showing separate body contacts formed for each memory cell the semiconductor memory device in accordance with the present invention.

Referring to FIGS. 13 and 14, top views of two configurations for body contacts are shown, in accordance with the present invention. As shown in FIG. 13, body contacts 142 are continuous across a semiconductor device 300. Body contacts 142 extend into isolation trenches 120, which are filled with a dielectric material, such as oxide. Body contacts 142 are included as part of an active area region 115. Buried straps 107 are shown extending from deep trenches 102 to body contacts 142. Advantageously, body contacts 142 provide an alternate oath to avoid pinching off an upper portion of active area region 115 (e.g., above a buried strap 107) to a lower portion of active area region 115 (e.g., below a buried strap 107). As shown in FIG. 14, an alternate embodiment includes body contacts 142 which are separated (e.g., no lateral connections between body contacts of adjacent memory cells).

Figure 15:
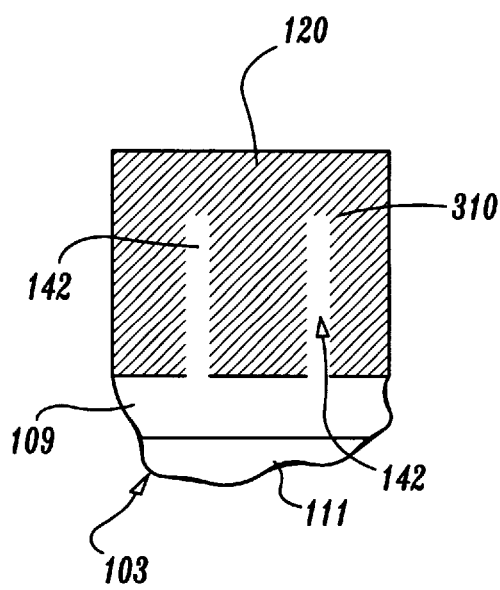
FIG. 15 is a cross-sectional view, taken at section line 15—15 of FIG. 13 in accordance with the present invention.

Referring to FIG. 15, a cross-sectional view taken at section line 15—15 in FIG. 13 is shown. A top portion 310 of body contact 142 extends above the location of a buried strap (see e.g., FIG. 12). Body contacts 142 are integrally formed from p-well 109 of substrate 103. An n-plate or n-well 111 is also shown.

Having described preferred embodiments for structure and method for forming a body contact for vertical transistor cells (which are intended to be illustrative and not limiting), it is noted that modifications and variations can be made by persons skilled in the art in light of the above teachings. It is therefore to be understood that changes may be made in the particular embodiments of the invention disclosed which are within, the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor memory cell, comprising:

a deep trench formed in a substrate including a storage node in a lower portion of the deep trench and a gate conductor in an upper portion of the deep trench, the gate conductor being electrically isolated from the storage node;

an active area adjacent to the deep trench and formed in the substrate to provide a channel region of an access transistor of the memory cell;

a buried strap formed to electrically connect the storage node to the active area when the gate conductor is activated; and a body contact formed apposite the deep trench in the active area and corresponding in position to the buried strap to prevent floating body effects due to outdiffussion of the buried strap into isolation trenches, the isolation trenches being formed adjacent to the active area.

2. The memory cell as recited in claim 1, wherein the body contact is integrally formed from the substrate.

3. The memory cell as recited in claim 1, wherein the body contact includes a portion of a p-well of the substrate.

4. The memory cell as recited in claim 1, wherein the memory cell is formed on a semiconductor memory chip having a plurality of memory cells, the memory chip including body contacts formed thereon which extend across a plurality of memory cells through isolation trenches, the isolation trenches being formed adjacent to active areas of the memory cells.

\* \* \* \* \*